United States Patent
Liu

(10) Patent No.: US 11,189,621 B2
(45) Date of Patent: Nov. 30, 2021

(54) DRAM ARRAY, SEMICONDUCTOR LAYOUT STRUCTURE THEREFOR AND FABRICATION METHOD

(71) Applicant: Changxin Memory Technologies, Inc., Anhui (CN)

(72) Inventor: Chih Cheng Liu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 16/850,469

(22) Filed: Apr. 16, 2020

(65) Prior Publication Data

US 2020/0243534 A1 Jul. 30, 2020

Related U.S. Application Data

(63) Continuation of application No. PCT/CN2018/112327, filed on Oct. 29, 2018.

(30) Foreign Application Priority Data

Oct. 30, 2017 (CN) .......................... 201711039711.X

(51) Int. Cl.
| | |
|---|---|
| *H01L 27/108* | (2006.01) |
| *H01L 21/762* | (2006.01) |
| *H01L 29/06* | (2006.01) |

(52) U.S. Cl.
CPC .. *H01L 27/10823* (2013.01); *H01L 21/76232* (2013.01); *H01L 27/10876* (2013.01); *H01L 29/0653* (2013.01)

(58) Field of Classification Search
CPC ..... H01L 27/108; H01L 21/762; H01L 29/06; H01L 27/10876; H01L 27/10823; H01L 27/10891; H01L 21/76232; H01L 29/0653
See application file for complete search history.

(56) References Cited

U.S. PATENT DOCUMENTS

| | | | | |
|---|---|---|---|---|
| 5,014,103 A | * | 5/1991 | Ema | ................... H01L 27/10808 257/296 |
| 6,180,453 B1 | * | 1/2001 | Sung | ................. H01L 27/10888 257/E21.019 |

(Continued)

FOREIGN PATENT DOCUMENTS

| | | |
|---|---|---|
| CN | 1815718 A | 8/2006 |
| CN | 101556964 A | 10/2009 |

(Continued)

OTHER PUBLICATIONS

PCT International Search Report and the Written Opinion dated Jan. 23, 2019, issued in related International Application No. PCT/CN2018/112327 (7 pages).

First Search dated Apr. 10, 2018, issued in related Chinese Application No. 201711039711.X (1page).

(Continued)

*Primary Examiner* — Sheng-Bai Zhu
(74) *Attorney, Agent, or Firm* — Sheppard Mullin Richter & Hampton LLP

(57) ABSTRACT

A semiconductor layout structure for a dynamic random access memory (DRAM) array comprises a plurality of active areas, an isolation structure and a plurality of word lines in a semiconductor substrate, where the isolation structure is situated among the plurality of active areas. Each of the plurality of active areas comprises a first segment extending in a first direction and a second segment extending in a second direction, one end of the first segment connected to an end of the second segment such that the active area presents a "V" shape. Two of the plurality of word lines intersect and traverse the first and second segments in each of the active areas respectively.

10 Claims, 8 Drawing Sheets

(56) References Cited

U.S. PATENT DOCUMENTS

| | | | |
|---|---|---|---|
| 6,410,948 B1* | 6/2002 | Tran | H01L 27/10885 |
| | | | 257/202 |
| 7,139,184 B2 | 11/2006 | Schloesser | |
| 7,471,547 B2 | 12/2008 | Schloesser | |
| 9,859,282 B1* | 1/2018 | Tseng | H01L 27/0207 |
| 2001/0008288 A1* | 7/2001 | Kimura | H01L 27/10808 |
| | | | 257/296 |
| 2005/0045933 A1* | 3/2005 | Kimura | H01L 27/10897 |
| | | | 257/296 |
| 2008/0253160 A1 | 10/2008 | Popp et al. | |
| 2013/0299884 A1 | 11/2013 | Lin et al. | |
| 2016/0099248 A1* | 4/2016 | Wu | H01L 29/0649 |
| | | | 257/296 |

FOREIGN PATENT DOCUMENTS

| | | |
|---|---|---|
| CN | 101853697 A | 10/2010 |
| CN | 103390621 A | 11/2013 |
| CN | 104347634 A | 2/2015 |
| CN | 107634057 A | 1/2018 |
| CN | 207320114 U | 5/2018 |
| WO | 2014184299 A1 | 11/2014 |

OTHER PUBLICATIONS

Supplementary Search dated Jun. 21, 2018, issued in related Chinese Application No. 201711039711.X (1page).
Second Office Action dated Jun. 29, 2018, issued in related Chinese Application No. 201711039711.X, with English machine translation (7 pages).

* cited by examiner

DRAM ARRAY, SEMICONDUCTOR LAYOUT STRUCTURE THEREFOR AND FABRICATION METHOD

CROSS-REFERENCE TO RELATED APPLICATION

This application is a continuation application of International Patent Application No. PCT/CN2018/112327, filed on Oct. 29, 2018, which claims priority to China Patent Application No. 201711039711.X, filed with the China Patent Office on Oct. 30, 2017 and entitled "DRAM ARRAY, SEMICONDUCTOR LAYOUT STRUCTURE THEREFOR AND FABRICATION METHOD." The above-reference applications are incorporated herein by reference in their entirety.

TECHNICAL FIELD

The present invention relates to the field of semiconductor technology and, in particular, to a dynamic random access memory (DRAM) array, a semiconductor layout structure for the DRAM array and a method for fabricating the DRAM array.

BACKGROUND

Integrated circuits (ICs) have evolved from integrating dozens of components on a single chip to integrating millions of components. The performance and complexity of ICs have far exceeded the original expectations. To further enhance complexity and circuit density (the number of components that can be accommodated within certain area of a chip), the feature size, also known as the geometry of IC components has become smaller and smaller. Increasing circuit density not only improves ICs' complexity and performance, but also lowers the price of the ICs for consumers. To further shrink the feature size of IC components is challenging because every process involved in IC fabrication has a limit. In other words, if a process is required to perform at a feature size smaller than its limit, then either the process or the component needs to be changed. In addition, traditional processes and materials often lag behind increasingly high demands of IC design.

Dynamic random access memories (DRAMs), a type of semiconductor devices, are common system memories. Although performance of DRAMs has been greatly improved, there is still a need for its further development. Memory size scale-down is a very challenging task because it is impossible to scale down every memory cell without compromising its memory capacity per unit area. This hinders the development of high-density memories. Accordingly, structures of memory cell arrays may often determine, to a large extent, the size of a memory chip.

Furthermore, existing DRAMs have a lot of other problems. For example, interference between word lines may generate leakage current detrimental to the performance of DRAMs. With the shrinking of the feature size of IC components, the interference between word lines has become an issue that could not be neglected any further.

SUMMARY OF THE INVENTION

The present disclosure provide a dynamic random access memory (DRAM) array, a semiconductor layout structure for the DRAM array and a method for fabricating the DRAM array to improve performance of the DRAM array.

According to one aspect of the present disclosure, a semiconductor layout structure of a DRAM array may comprise a plurality of active areas, an isolation structure and a plurality of word lines in a semiconductor substrate, wherein:

the isolation structure is situated among the plurality of active areas;

each of the active areas comprises a first segment extending in a first direction and a second segment extending in a second direction, one end of the first segment connected to an end of the second segment such that the active area presents a "V" shape; and two of the plurality of word lines intersect and traverse the first and second segments in each of the active areas respectively.

In some embodiments, in the semiconductor layout structure of the DRAM array, the active areas may be arranged in an array that includes a plurality of columns, and the active areas arranged in the same one of the plurality of columns may be aligned with one another.

In some embodiments, in the semiconductor layout structure of the DRAM array, the "V" shapes of the active areas in the same one of the plurality of columns have openings oriented toward the same direction. In some embodiments, the "V" shapes of the active areas in adjacent ones of the plurality of columns have openings oriented toward a different direction. In some embodiments, in the semiconductor layout structure of the DRAM array, the "V" shapes of the active areas have openings with an angle ranging from 140° to 170°.

In some embodiments, the semiconductor layout structure of the DRAM array may comprise two contacts situated at the ends of the "V" shape of each of the plurality of active areas. In some embodiments, a middle portion of the "V" shape of each of the plurality of active areas is configured to connect with a bit line.

According to another aspect of the present disclosure, a DRAM array may comprise:

a semiconductor substrate, wherein a plurality of active areas are defined in the semiconductor substrate by an isolation structure, each of the active areas comprising a first segment extending in a first direction and a second segment extending in a second direction, one end of the first segment connected to an end of the second segment such that the active area presents a "V" shape; and a plurality of word lines formed in the semiconductor substrate, wherein two of the plurality of word lines intersect and traverse the first and second segments in each of the active areas respectively.

In some embodiments, in the DRAM array, the active areas may be arranged in an array that includes a plurality of columns, and the active areas arranged in the same one of the plurality of columns may be aligned with one another.

In some embodiments, in the DRAM array, the "V" shapes of the active areas in the same one of the plurality of columns have openings oriented toward the same direction. In some embodiments, in the DRAM array, the "V" shapes of the active areas in adjacent ones of the plurality of columns have openings oriented toward a different direction. In some embodiments, in the DRAM array, the "V" shapes of the active areas have openings with an angle ranging from 140° to 170°.

In some embodiments, the DRAM array may comprise two contacts situated at the ends of the "V" shape of each of the plurality of active areas. In some embodiments, a middle portion of the "V" shape of each of the plurality of active areas is configured to connect with a bit line.

According to yet another aspect of the present disclosure, a method for fabricating a DRAM array may comprise:

providing a semiconductor substrate;

forming an isolation structure in the semiconductor substrate to define a plurality of active areas in the semiconductor substrate, each of the active areas comprising a first segment extending in a first direction and a second segment extending in a second direction, one end of the first segment connected to an end of the second segment so that the active area presents a "V" shape; and forming a plurality of word lines in the semiconductor substrate, such that two of the plurality of word lines intersect and traverse the first and second segments in each of the active areas respectively.

In some embodiments, forming an isolation structure in the semiconductor substrate to define a plurality of active areas in the semiconductor substrate may comprise:

forming trenches in the semiconductor substrate by photolithography and etching processes, the trenches defining a plurality of V-shaped structures arranged in an array that includes a plurality of columns;

filling the trenches with an isolating material to form the isolation structure; and doping the plurality of V-shaped structures to form the plurality of active areas.

In some embodiments, in the method, the "V" shapes of the active areas in the same one of the plurality of columns have openings oriented toward the same direction. In some embodiments, in the method, the "V" shapes of the active areas in adjacent ones of the plurality of columns have openings oriented toward a different direction. In some embodiments, in the method, the "V" shapes of the active areas have openings with an angle ranging from 140° to 170°.

In some embodiments, the method may comprise situating two contacts at the ends of the "V" shape of each of the plurality of active areas. In some embodiments, a middle portion of the "V" shape of each of the plurality of active areas is configured to connect with a bit line.

In the DRAM array, the semiconductor layout structure and method provided in the present disclosure, each of the active areas in the DRAM array comprises a "V" shape. As a result, upon occurrence of a row hammer event, the average migration path of free electrons will be terminated around the corner of the V-shaped active areas, and the free electrons may reunite with holes, thus reducing or avoiding leakage current, and enhancing the performance of the device.

Figure 1:
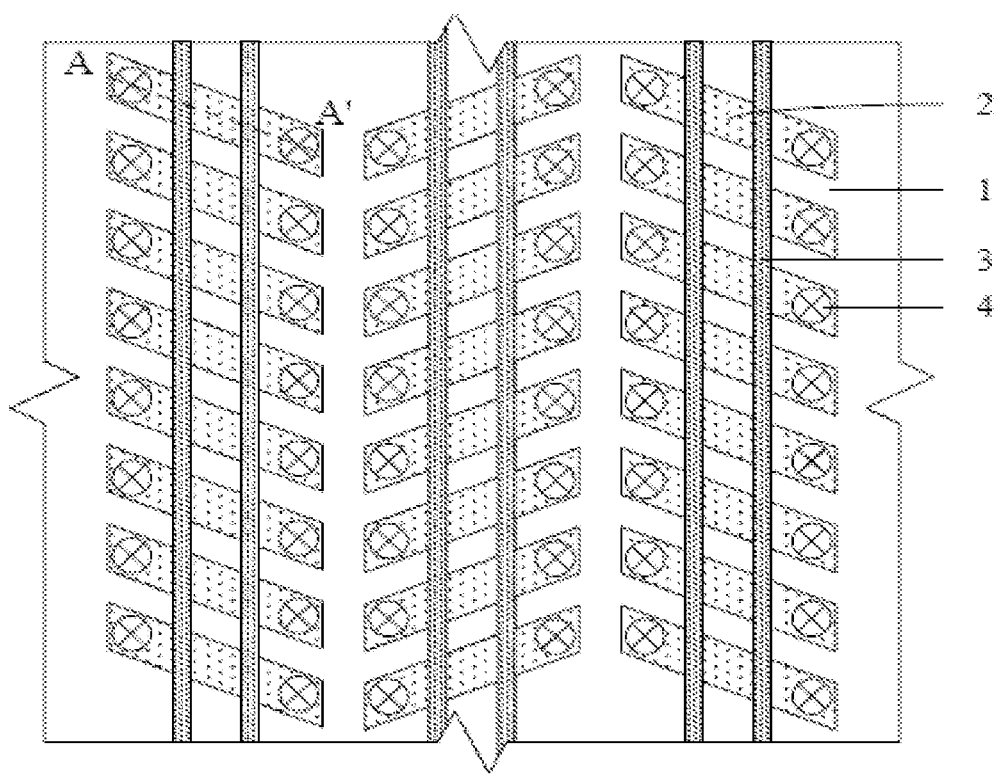
FIG. 1 is a schematic diagram illustrating an exemplary dynamic random access memory (DRAM) array in accordance with various embodiments.

List of Reference Numerals in the Drawings are provided as follows.

| | |
|---|---|
| 1, 100 | semiconductor substrate |
| 2, 200 | active area |
| 201 | first segment |
| 202 | second segment |
| 203 | sidewall |
| 210 | P-well |
| 220 | lightly-doped region |
| 3, 300 | word line |
| 31, 310 | first dielectric layer |
| 32, 320 | first conductive layer |
| 4, 400 | contact end, contact node, or contact |
| 5, 500 | free electron |
| 600 | corner |
| 700 | isolation structure |

DETAILED DESCRIPTION

Dynamic random access memory (DRAM) arrays, semiconductor layout structure therefor and fabrication methods thereof according to the present disclosure will be described in greater detail below with reference to the accompanying drawings which provide preferred embodiments of the present disclosure. Those skilled in the art can make changes to the embodiments disclosed herein while still obtaining the beneficial results thereof. Therefore, the following description shall be construed as being intended to be widely known by those skilled in the art rather than as limiting the present disclosure.

In the following description, when any layer (or film), region, pattern or structure is described as being "on" (or overlying) a substrate, another layer (or film), another region, a welding pad and/or another pattern, the layer, region, pattern or structure may be disposed directly on the substrate, the other layer (or film), the other region, the welding pad and/or the other pattern, or alternatively with one or more other layers inserted therebetween. In addition, any layer described as being "under" (or underlying) another layer may be disposed directly under the other layer, or alternatively with one or more yet other layers inserted therebetween. Reference to the overlying and underlying layers may be made in the appended figures.

Figure 2:
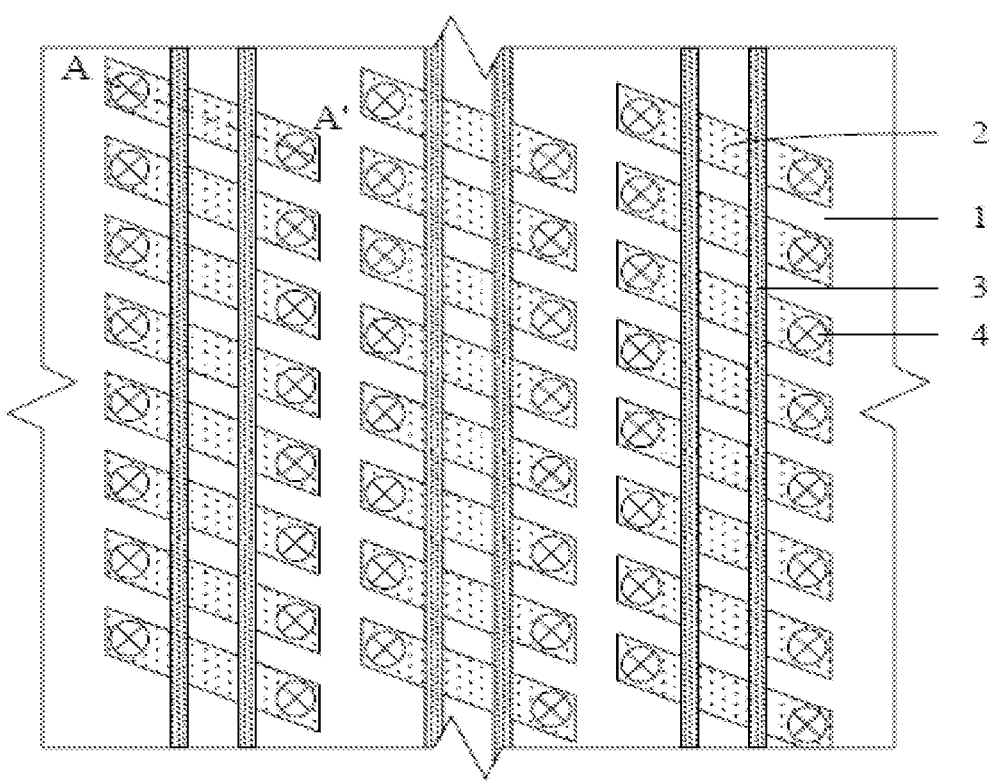
FIG. 2 is a schematic diagram illustrating another exemplary DRAM array in accordance with various embodiments.

FIG. 1 is a schematic diagram illustrating an exemplary DRAM array, and FIG. 2 is a schematic diagram illustrating another exemplary DRAM array in accordance with various embodiments. As shown in FIGS. 1 and 2, each of the DRAM arrays includes a semiconductor substrate 1, active areas 2, word lines 3 and contacts 4. The word lines 3 are situated in the semiconductor substrate 1 and traverse the active areas 2. In the DRAM array illustrated in FIG. 1, horizontally adjacent active areas extend in different directions so that they as a whole form a wave-shaped active region. In the DRAM array illustrated in FIG. 2, adjacent active areas extend in the same direction, and therefore they form a stripe-shaped active region. Both of these active area layouts (such as the wave-shaped active region and the stripe-shaped active region) can improve process margins. However, as the size of IC components has kept shrinking, the word line-to-word line coupling problem (also referred to as row hammer event) has deteriorated to the extent that its significant negative affect (e.g., degraded DRAM performance due to leakage current caused by the row hammer) cannot be ignored any more.

Figure 3:
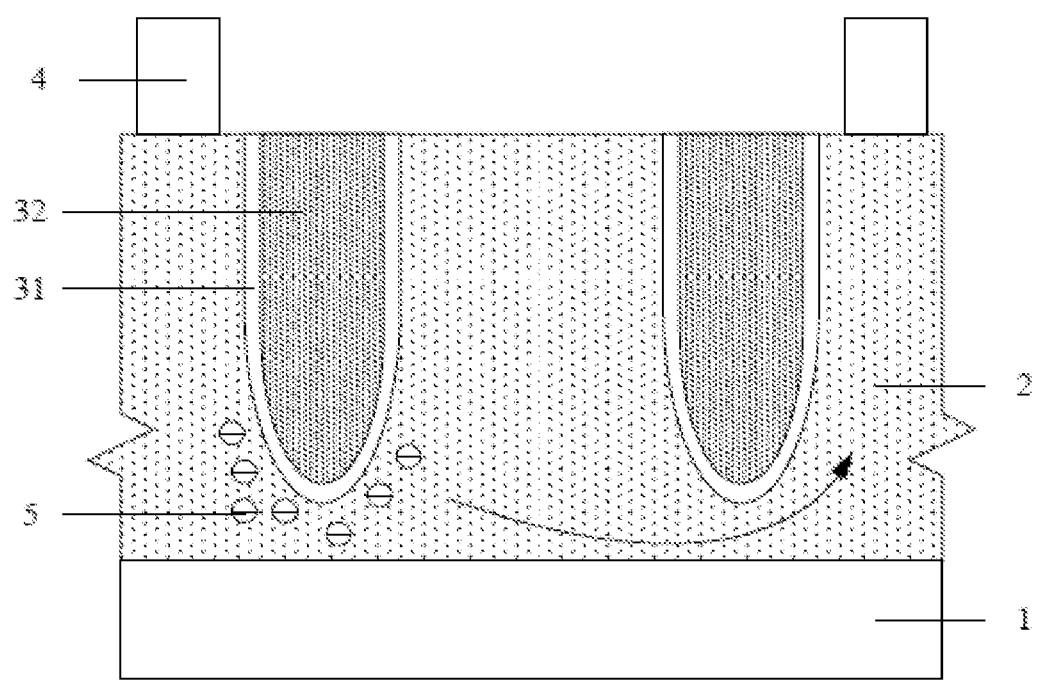
FIG. 3 is a schematic diagram illustrating a sectional view of FIGS. 1 and 2 along an A-A' plane in accordance with various embodiments.

Referring to FIG. 3, a schematic diagram is provided to illustrate a sectional view of the DRAM arrays in FIGS. 1 and 2 along an A-A' plane in accordance with various embodiments. In FIGS. 1 and 2, the exemplary DRAM arrays are illustrated from a top view (e.g., assuming that the contact nodes 4 are on the top of the DRAM arrays and the substrate 1 is at the bottom of the DRAM arrays). The A-A' plane labeled in FIGS. 1 and 2 may be along the extending direction of the active area 2 and perpendicular to the view plane of FIGS. 1 and 2 (i.e., the top view of the DRAM arrays).

As shown in FIG. 3, each of the word lines 3 includes a first dielectric layer 31 and a first conductive layer 32. There may also be multiple free electrons 5 in the active area 2. If a word line 3 is excessively coupled to an adjacent word line 3, a row hammer event may occur, causing the free electrons 5 to migrate from one region to another region of the active area 2 and thus generate a leakage current. For example, if the word line 3 shown on the left in FIG. 3 is defective, when a sequential signal of a value "0" (i.e., a low level signal) is applied to the left contact 4 associated with the left word line 3, and a sequential signal of a value "1" (i.e., a high level signal) is applied to the right contact 4 associated with the word line 3 on the right, the free electrons 5 may migrate from the active area around the left word line 3 to the active area around the right word line 3, creating a leakage current. Additionally, even when the sequential signal applied to the left contact 4 is of a value "1" (i.e., a high level signal), a leakage current may be still created though it may be smaller in magnitude.

Figure 4:
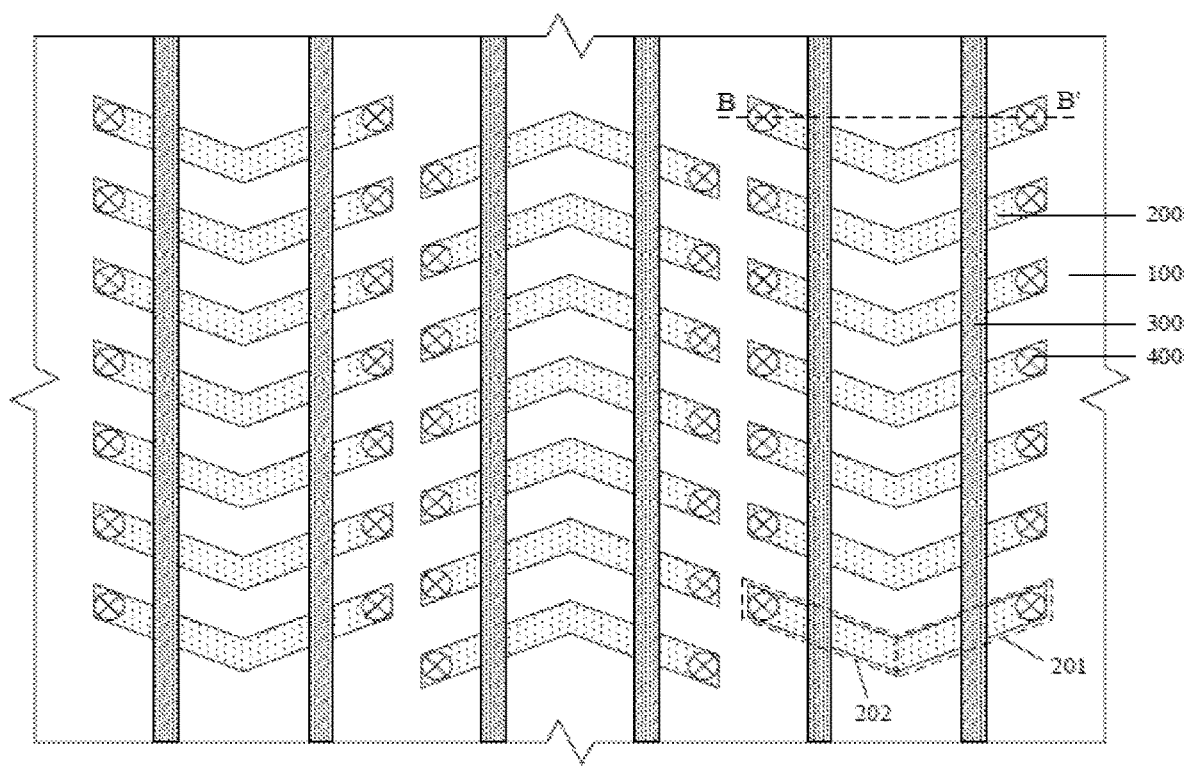
FIG. 4 is a schematic diagram illustrating a semiconductor layout structure of a DRAM array in accordance with various embodiments.

In some embodiments, the leakage currents may be effectively reduced by blocking the migration path of the free electrons, and thus performance of the DRAM arrays may be improved. Referring to FIG. 4, a schematic diagram illustrating a semiconductor layout structure of a DRAM array is provided in accordance with various embodiments. As illustrated in FIG. 4, the semiconductor layout structure of the DRAM array may include: a plurality of active areas 200, an isolation structure and a plurality of word lines 300 arranged in a semiconductor substrate 100.

The isolation structure is situated among the active areas 200. There may be a plurality of isolation structures among the plurality of active areas 200. One or more isolation structures may be located in between two different active areas 200. For example, an active area 200 may be defined by one or more isolation structures. In some embodiments, each active area 200 may constitute a memory cell. The isolation structure is not provided with a reference numeral in FIG. 4, and is illustrated in FIG. 6 as referenced by a numeral 700. Referring to FIG. 6, a sectional view of the DRAM array in FIG. 4 along a B-B' plane is illustrated in accordance with various embodiments. In FIG. 4, the DRAM array is viewed from a top view (i.e., from the side of the contacts 400). The B-B' plane may be along a straight line between two contacts 400 and perpendicular to the view plane of FIG. 4 (i.e., the top view of the DRAM arrays). As illustrated in FIG. 6, the DRAM array includes the isolation structure 700 which is located between two adjacent word lines 300. The isolation structure 700 and other components of the DRAM array in FIG. 6 will be described in further detail below with reference to FIGS. 4-7.

Referring back to FIG. 4, each of the active areas 200 includes a first segment 201 extending in a first direction and a second segment 202 extending in a second direction. In some embodiments, the first direction and the second direction are different. For example, the first direction and the second direction may form an angle with a range of, e.g., 140° to 170°. In some embodiments, one end of the first segment 201 is connected to an end of the second segment 202 such that the active area 200 may present a "V" shape. For example, the first segment 201 and the second segment 202 may represent the two arms of the "V" shape respectively, and the connection area between the ends of the first segment 201 and the second segment 202 may represent the valley point of the "V."

As illustrated in FIG. 4, two of the plurality of word lines 300 may intersect and traverse the first segment 201 and the second segment 202 in each of the active areas 200 respectively. For example, between two adjacent word lines 300 intersecting and traversing the first segment 201 and the second segment 202, the active area is of a shape "V." In some embodiments, the active areas 200 may be doped regions through ion implantation. The type of ion implantation for the active areas 200 may be selected according to practical needs.

As shown in FIG. 4, the active areas 200 may be arranged in an array. The active areas 200 in the array may be deemed as being divided into a plurality of columns. In some embodiments, the active areas 200 arranged in the same one column may be aligned with one another. Further, the array may also be deemed as being divided into a plurality of rows. Similarly, the active areas 200 arranged in one row may also be aligned with one another. In some embodiments, the openings of all V-shaped active areas 200 in each same column may be oriented toward the same direction. In addition, in each column, the active areas 200 may be equally spaced, and therefore an uniform distribution of the active areas 200 may be achieved. In some embodiments, the openings of the V-shaped of active areas 200 in adjacent columns may be oriented differently, as shown in FIG. 4.

As described above, the angle of the opening of a V-shaped of active area 200 (e.g., the angle formed by the first direction of the first segment 201 and the second direction of the second segment 202) may range from 140° to 170°. However, the angle of the V-shaped opening of active areas 200 may be not limited to the aforementioned range and may be selected as greater or smaller values according to practical process or product requirements.

Still referring to FIG. 4, the word lines 300 are disposed in the semiconductor substrate 100 so as to traverse the first segments 201 and the second segments 202. The word lines 300 may extend straight along the columns (i.e., the column-wise direction of the arrangement of the active areas 200). In other words, the first segments 201 and the second segments 202 are respectively traversed by different word lines 300. Moreover, in each column, the first segments 201 of the active areas 200 are all traversed by the same word line 300. Similarly, the second segments 202 of the active areas 200 are also all traversed by the same word line 300 which is different from the one traversing the first segments 201.

In this way, each of the active areas 200 is trisected by the word lines 300. That is, each of the active areas 200 is divided into three portions by the two word lines 300 traversing the first segment 201 and the second segment 202 respectively. The three portions of one active area 200 may be of the same or similar size, or may be of different sizes alternatively. The two end portions of each active area 200 may be designed as contact areas for accommodating the contacts 400 and the middle portion of the active area 200 may be designed as bit line contact area for accommodating a bit line (not shown). That is, the bit line may be situated across the corner area of the "V" shape of the active area. In some embodiments, the contacts 400 and the bit line are all situated above the active area 200.

Figure 5:
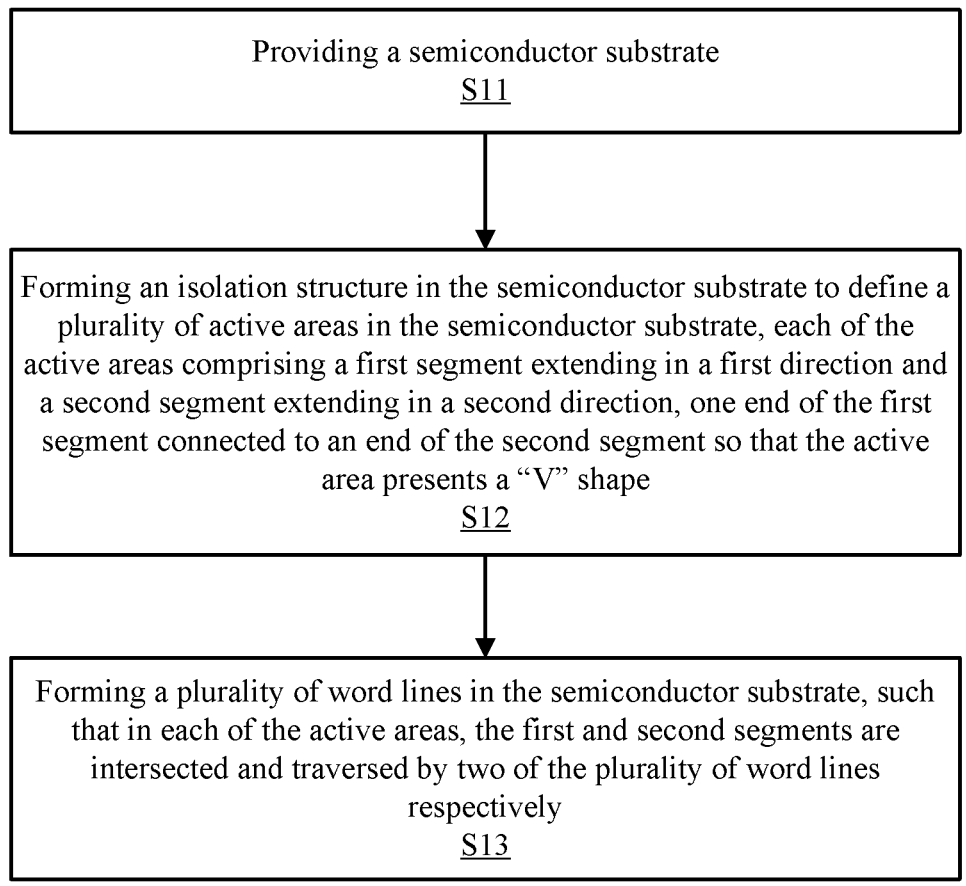
FIG. 5 is a flowchart illustrating a method for fabricating a DRAM array in accordance with various embodiments.
Figure 6:
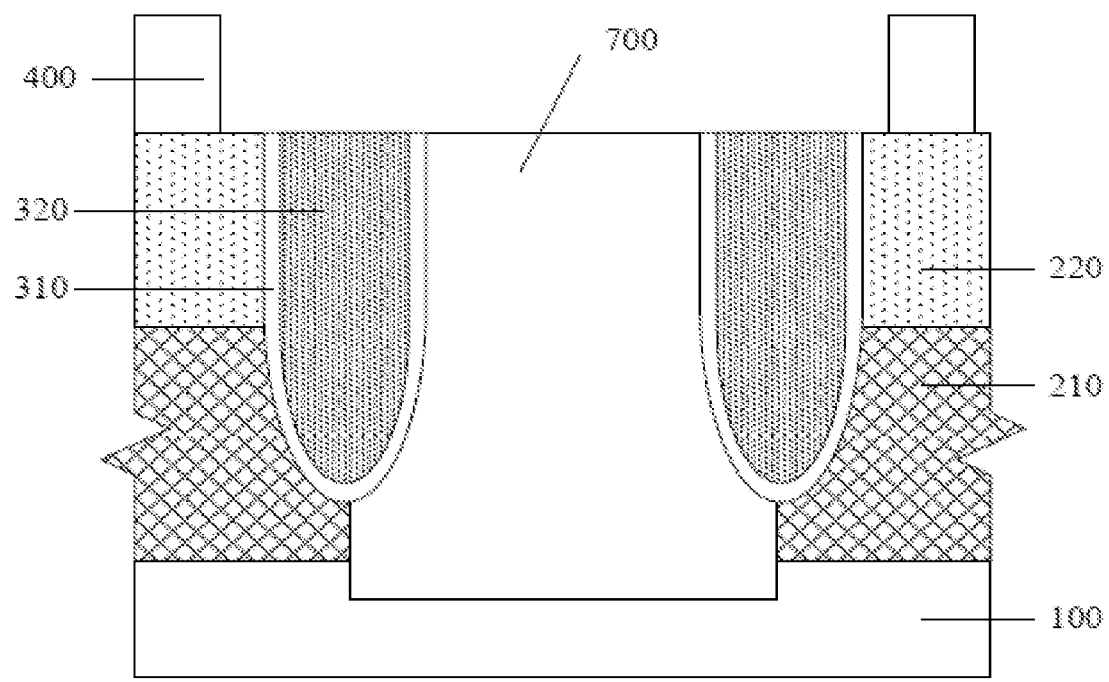
FIG. 6 is a schematic diagram illustrating a sectional view of a DRAM array in FIG. 4 along a B-B' plane in accordance with various embodiments.

Based on the above layout structure as illustrated in FIG. 4, a method 500 for fabricating a DRAM array (e.g., a DRAM array having the layout structure shown in FIG. 4) may be provided in the flowchart of FIG. 5. Referring to FIG. 5, the method 500 may include the following steps.

In step S11, a semiconductor substrate 100 is provided.

In step S12, an isolation structure 700 (see FIG. 6) is formed in the semiconductor substrate 100. The isolation structure 700 is configured to define a plurality of active areas 200 in the semiconductor substrate 100. For example, an isolation structure 700 may be located in between two different and adjacent active areas 200. Each of the active areas 200 includes a first segment 201 extending in a first direction and a second segment 202 extending in a second direction. One end of the first segment 201 may be connected to an end of the second segment 202 so that the active area 200 may present a "V" shape.

In step S12, a plurality of word lines 300 are formed in the semiconductor substrate 100 such that in each of the active areas 200, two of the plurality of word lines 300 intersect and traverse the first segment 201 and the second segment 202 respectively. An isolation structure 700 may be located between two adjacent word lines 300.

The method 500 will be described in greater detail with reference to FIG. 6. As described above, FIG. 6 is a schematic diagram illustrating a sectional view of a DRAM array in FIG. 4 along a B-B' plane in accordance with various embodiments. In step S11 of method 500, a semiconductor substrate 100 is provided. The semiconductor substrate 100 may be a monocrystalline silicon substrate, a polycrystalline silicon substrate, an amorphous silicon substrate, a silicon germanium (SiGe) compound substrate, a silicon-on-insulator (SOI) substrate or another substrate made of other materials known to those skilled in the art. In the semiconductor substrate 100, doped regions or other semiconductor structures may be formed, which will not be described in detail by the present disclosure.

In step S12 of method 500, the formation of the isolation structure 700 (shown in FIG. 6) for defining the plurality of active areas 200 in the semiconductor substrate 100 may be achieved by:

forming trenches in the semiconductor substrate 100 by photolithography and etching processes, where the trenches define a plurality of V-shaped structures that are arranged in an array that includes a plurality of columns;

removing the photoresist used in the photolithography process;

filling an isolation material into the trenches to form the isolation structure 700; and doping the plurality of V-shaped structures to form a plurality of active areas 200.

The formation of trenches which define the array of V-shaped structures can be accomplished by photolithography and etching processes using, for example, a photomask designed based on the layout structure of the array as described above.

Each of the V-shaped structures may include a first segment 201 extending in a first direction and a second segment 202 extending in a second direction. One end of the first segment 201 may be connected to an end of the second segment 202 to form the V-shaped structure. In some embodiments, the first direction and the second direction are different, and may form an angle ranging from 140° to 170°. That is, the openings of the V-shaped structures may have an angle ranging from 140° to 170°. Alternatively, the angle of the openings of the V-shaped structures is not limited to the aforementioned range and may be selected to be greater or smaller values according to practical process or product requirements. In some embodiments, in each column, the openings of all V-shaped structures may be oriented toward the same direction. Further, in each column, the V-shaped structures may be equally spaced and therefore an uniform distribution of the V-shaped structures may be achieved. In some embodiments, the openings of the V-shaped structures in adjacent columns may be oriented toward different directions.

In some embodiments, the isolation material may be silicon oxide. The isolation material may be filled into the trenches to form the isolation structure 700 using any suitable techniques known to those skilled in the art. In some embodiments, any appropriate doping process (e.g., ion implantation) may be used to form the active areas 200. The types and doses of the doped ions may be selected properly according to practical needs. For example, the ion implantation process used to form the active areas 200 may include forming P-wells 210 and lightly-doped regions 220 by implanting boron (B), gallium (Ga) or any other P-dopant. The P-wells 210 are buried within the semiconductor substrate 100, and the lightly-doped regions 220 overlie the P-wells 210. The dopant in the lightly-doped regions 220 may be of the same type as that in the P-wells, but may be present at a lower concentration.

In some embodiments, the isolation structure 700 may have a height greater than that of the lightly-doped regions 220. As a result, after the filling of the isolating material and the ion implantation process, good isolation effect will be achieved. In some embodiments, after doping, the V-shaped structures form the V-shaped active areas 200. The V-shaped active areas 200 are arranged in an array and the active areas 200 that are arranged in the same column are aligned with one another.

Each of the V-shaped active areas 200 may include a first segment 201 extending in a first direction and a second segment 202 extending in a second direction, as shown in FIG. 4. One end of the first segment 201 is connected to an end of the second segment 202 such that the active area 200 comprises a "V" shape. In some embodiments, the first direction and the second direction are different, and may form an angle ranging from 140° to 170°. That is, the V-shaped active areas 200 may have open angles ranging from 140° to 170°. Alternatively, the angle of the openings of the V-shaped structures may not be limited to the aforementioned range and can be selected to be greater or smaller values according to practical process or product requirements.

In some embodiments, in each column, the openings of all V-shaped active areas 200 may be oriented toward the same direction. Further, in each column, the V-shaped active areas 200 may be equally spaced and therefore an uniform distribution of the V-shaped active areas 200 may be achieved. In some embodiments, the openings of the V-shaped active areas 200 in adjacent columns may be oriented toward different directions, as shown in FIG. 4.

In step S13, the formation of the plurality of word lines 300 in the semiconductor substrate 100 may be accomplished in a manner as described below.

The word lines 300 may be so formed as to extend in a predetermined direction. For example, the trenches for forming the word lines 300 may be formed so as to extend along the column-wise direction as shown in FIG. 4 and traverse the active areas 200 and the isolation structure 700. In some embodiments, the trenches may have a depth that is smaller than a thickness of the active areas 200. For example, the trenches may be deeper than the lightly-doped regions 220, but shallower than the P-wells 210. That is, the bottom of the trenches may be lower than the bottom of the lightly-doped regions 220, but higher than the bottom of the P-wells 210. In some embodiments, each of the formed trenches may have curved or inclined sidewalls, and a curved or inclined bottom.

In some embodiments, a first dielectric layer 310 is formed in each of the trenches. For example, the first dielectric layer 310 may go with the shape of the trench and may have a small thickness of, for example, 40 Å or less. In some embodiments, the first dielectric layer 310 may be formed by a thermal oxidation process such as a dry thermal oxidation process. Alternatively, the first dielectric layer 310 may also be formed by, for example, chemical vapor deposition (CVD) or the like. In some embodiments, the first dielectric layer 310 may be a silicon oxide layer.

In some embodiments, after the first dielectric layer 310 is formed, a first conductive layer 320 is formed on the first dielectric layer 310 in each of the trenches. In some embodiments, the first conductive layer 320 may be deposited using atomic layer deposition (ALD). Alternatively, the first conductive layer 320 may be formed by thermal chemical vapor deposition (TCVD) or the like. The first conductive layer 320 may be fabricated from one of several materials including but not being limited to, for example, metallic materials such as tungsten, titanium nitride, tantalum nitride, titanium aluminum alloys, etc. For example, the first conductive layer 320 may be made of tungsten, and thus has a low sheet resistivity "Rs" and supports a high current. The first conductive layers 320 and first dielectric layers 310 together constitute the word lines 300.

In some embodiments, the word lines 300 may intersect the active areas 200 in such a manner that they may contact or connect with gate structures in the active areas 200. In some embodiments, the word lines 300 extend along the column-wise direction of the array of the active areas 200. Therefore, the gate structures of the active areas 200 in each column are connected to the same one word line 130.

In some embodiments, the gate structures in the active areas 200 may also constitute parts of the word lines 300. Further, the portions of the isolation structure 700 that are traversed by the word lines 300 may also contain the materials of the word lines (i.e., the materials of the first conductive layers 320 and the first dielectric layers 310). Therefore, the materials of the word line deposited within the isolation structure 700 and the gate structures are connected to integrally form the word lines 300. Furthermore, the first conductive layers 320 in the active areas 200 may constitute gate material layers and be connected to the first conductive layers 320 in the isolation structure 700. The first dielectric layers 310 may prevent the first conductive layers 320 from being electrically connected to other conductors. Since the gate structures constitute a part of the word lines 300, the formation of the word lines 300 is simplified.

As shown in FIG. 6, the word lines 300 may have a thickness smaller than a thickness of the isolation structure 700, and thus a good isolation effect can be attained. That is, the isolation structure 700 extends deeper towards the substrate 100 than the word lines 300 do.

In some embodiments, a doping process for forming the active areas 200 may be performed subsequent to the formation of the word lines 300. In some embodiments, subsequent to the formation of the word lines 300, bit lines may be formed, description of which will be omitted herein for the sake of simplicity.

After the word lines 300 are formed, each of the active areas 200 is trisected by the word lines 300. That is, each active area 200 is divided into three portions by the word lines 300. The contacts 400 are then formed on the two end portions, for example, by using a proper contact fabrication technique.

The DRAM array obtained according to the above method 500 may include:

the semiconductor substrate 100, in which the isolation structure 700 is formed to define the active areas 200, each including a first segment 201 extending in the first direction and a second segment 202 extending in the second direction, one end of the first segment 201 connected to an end of the second segment 202 such that the active area 200 presents a "V" shape; and a plurality of word lines 300 in the semiconductor substrate 100, wherein two of the plurality of word lines 300 intersect and traverse the first segment 201 and the second segment 202 in each of the active areas 200 respectively.

In some embodiments, the active areas 200 are doped regions obtained through one or more ion implantation processes selected according to practical needs. Referring back to FIG. 4, the active areas 200 may be arranged in an array and the active areas 200 arranged in one column of the array are aligned with one another. Alternatively, the array may also include a plurality of rows of active areas 200. Similarly, the active areas 200 arranged in one row of the array may also be aligned with one another.

In some embodiments, the openings of all V-shaped active areas 200 in each column may be oriented toward the same direction. In addition, in each column, the active areas 200 may be equally spaced, and therefore an uniform distribution of the active areas 200 may be achieved. In some embodiments, the openings of the V-shaped of active areas 200 in adjacent columns may be oriented differently.

In some embodiments, the angle of the opening of a V-shaped of active area 200 (e.g., the angle formed by the first direction of the first segment 201 and the second direction of the second segment 202) may range from 140° to 170°. However, the angle of the V-shaped opening of active areas 200 may be not limited to the aforementioned range and may be selected as greater or smaller values according to practical process or product requirements.

Still referring to FIG. 4, the word lines 300 are disposed in the semiconductor substrate 100 so as to traverse the first segments 201 and the second segments 202. The word lines 300 may extend straight along the columns (i.e., the column-wise direction of the arrangement of the active areas 200). In other words, the first segments 201 and the second segments 202 are traversed by different word lines 300. Moreover, in each column, the first segments 201 of the active areas 200 are all traversed by the same word line 300. Similarly, the second segments 202 of the active areas 200 are also all traversed by the same word line 300 which is different from the one traversing the first segments 201.

In this way, each of the active areas 200 is trisected by the word lines 300. That is, each of the active areas 200 is divided into three portions by the two word lines 300 traversing the first segment 201 and the second segment 202 respectively. The two end portions of each active area 200 may be designed as contact areas for accommodating the contacts 400 and the middle portion of the active area 200 may be designed as bit line contact area for accommodating a bit line (not shown). In some embodiments, the contacts 400 and the bit line are all situated above the active area 200. Referring to FIG. 6, the word lines 300 may have a thickness that is smaller than a thickness of the isolation structure 700, and thus a good isolation effect can be attained.

Figure 7:
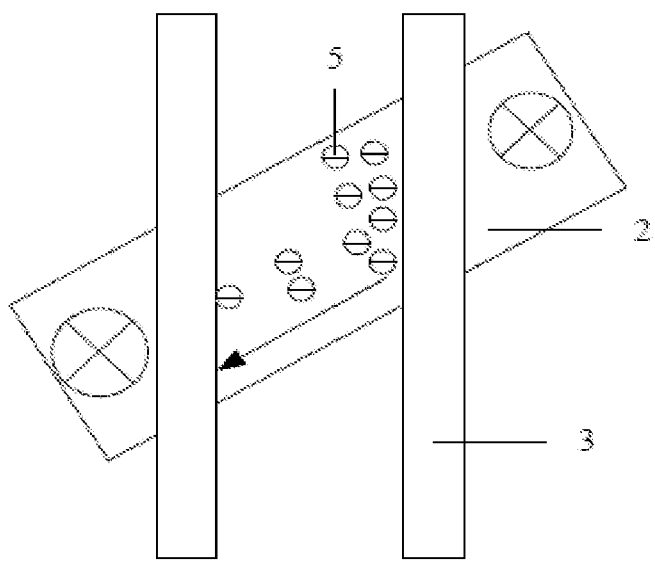
FIG. 7 is a schematic diagram illustrating electron leakage upon occurrence of a row hammer event in the DRAM array of FIG. 1 or 2 in accordance with various embodiments.

Referring now to FIG. 7, a schematic diagram is provided illustrating electron leakage upon occurrence of a row hammer event in the DRAM array of FIG. 1 or 2 in accordance with various embodiments. As shown in FIG. 7, upon the occurrence of a row hammer event on a word line 3, the free electrons 5 in an associated active area 2 migrate, for example, in the direction marked by the arrow toward another word line 3 on the left, thus creating a leakage current.

Figure 8:
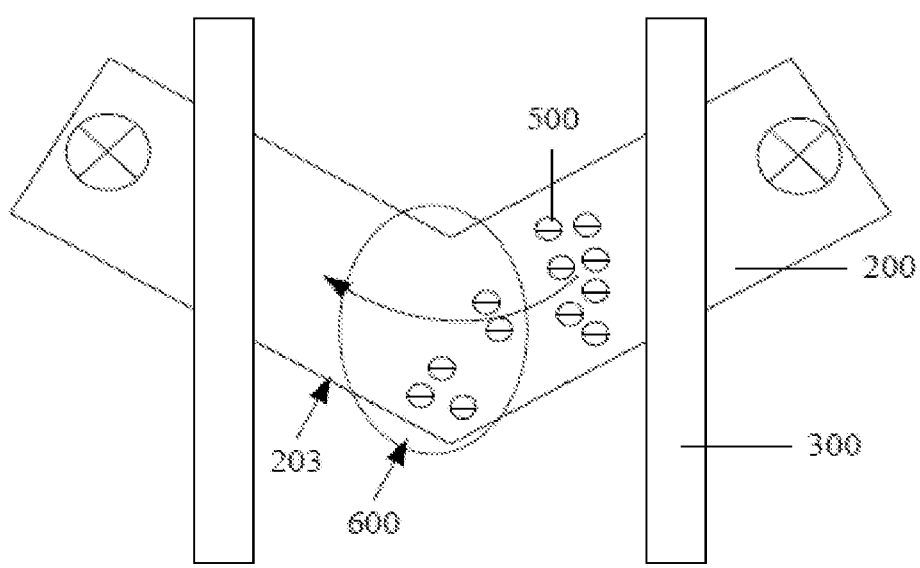
FIG. 8 is a schematic diagram illustrating electron leakage upon occurrence of a row hammer event in a DRAM array in accordance with some embodiments of the present disclosure.

Referring also to FIG. 8, a schematic diagram is provided illustrating electron leakage upon occurrence of a row hammer event in a DRAM array in accordance with some embodiments of the present disclosure. As shown in FIG. 8, upon the occurrence of a row hammer event on a word line 300, the free electrons 500 in an associated active area 200 also migrate, for example, in the direction marked by the arrow. However, due to the "V" shape of the active area 200, when the free electrons 500 migrate from one end of the active area 200 toward the other end thereof, the average migration path of the free electrons 500 may be terminated by the sidewall 203 around the corner 600. Therefore, the free electrons 500 may reunite with holes. As a result, leakage current may be reduced or prevented. In addition, leakage current is caused by a voltage applied across the corresponding contacts 400 that may form an electron migration path in the active area 200 and from one contact 400 to the other contact 400. The "V" shape of the active area 200 enlarges the path that the free electrons 500 may migrate to reach the other contact 400, thus suppressing the leakage current.

The present disclosure mitigates the influence of the row hammer effect by changing the shape, but not critical dimension, of the active areas. According to actual measurements, the change of the shape of the active areas reduces the loss rate of free electrons by over 50%, and largely improves performance of the device.

In summary, the DRAM array, layout structure and fabrication method in the present disclosure provide active areas, each of which presents a "V" shape. As a result, when a row hammer event occurs, the average migration path of free electrons may be terminated around the corner of the V-shaped active area, and the free electrons may be re-combined with holes, thus reducing or avoiding leakage current, and enhancing performance of the device.

The description presented above is merely some preferred embodiments of the present disclosure and does not limit the scope thereof in any sense. Any and all changes and modifications made by those of ordinary skills in the art based on the above teachings fall within the scope as defined in the appended claims.

What is claimed is:

1. A semiconductor layout structure for a dynamic random access memory (DRAM) array, comprising a plurality of active areas, an isolation structure and a plurality of word lines in a semiconductor substrate, wherein:
    the isolation structure is situated among the plurality of active areas;
    each of the plurality of active areas comprises a first segment extending in a first direction and a second segment extending in a second direction, each of the first segment and the second segment having a first end and a second end opposing the first end, the first end of the first segment connected to the first end of the second segment such that the active area presents a "V" shape;
    a right-end contact and a left-end contact situated, respectively, at the second end of the first segment and the second end of the second segment on each of the plurality of active areas; and
    two of the plurality of word lines intersect and traverse the first and second segments in each of the active areas respectively,
    wherein the isolation structure is adjacent to the two word lines and located on interior sides of the two word lines facing towards the first ends, and a lightly-doped region and a P-well are adjacent to the two word lines and located on exterior sides of the two word lines facing away from the first ends, the lightly-doped region overlying the P-well and having a less doping concentration than the P-well,
    wherein the active areas are arranged in an array that includes a plurality of columns, and wherein the active areas arranged in the same one of the plurality of columns are aligned with one another, and
    the "V" shapes of the active areas in one of the plurality of columns have openings oriented toward a first opening, the "V" shapes of the active areas in a first adjacent column and a second adjacent column of the plurality of columns adjacent to the one of the plurality of columns have openings oriented toward a second opening opposite to the first opening, and
    wherein the first segments of the active areas in the one of the plurality of columns are each respectively aligned with the second segments of the active areas in the first adjacent column, and the second segments of the active areas in the one of the plurality of columns are each respectively aligned with the first segments of the active areas in the second adjacent column, the first adjacent column is located to the right side of the one of the plurality of columns, the left-end contacts of the active areas in the first adjacent columns are all located to the right side of the right-end contacts of the active areas in the one of the plurality of columns.

2. The semiconductor layout structure of claim 1, wherein the "V" shapes of the active areas have openings with an angle ranging from 140° to 170°.

3. The semiconductor layout structure of claim 1, wherein each of the plurality of active areas is divided into three portions by the two of the plurality of word lines traversing the first segment and the second segment, the three portions being of the same size.

4. A dynamic random access memory (DRAM) array, comprising:
    a semiconductor substrate, wherein a plurality of active areas are defined in the semiconductor substrate by an isolation structure, each of the plurality of active areas comprising a first segment extending in a first direction and a second segment extending in a second direction, each of the first segment and the second segment having a first end and a second end opposing the first end, the first end of the first segment connected to the first end of the second segment such that the active area presents a "V" shape;
    a right-end contact and a left-end contact situated, respectively, at the second end of the first segment and the second end of the second segment on each of the plurality of active areas; and a plurality of word lines formed in the semiconductor substrate, wherein two of the plurality of word lines intersect and traverse the first and second segments in each of the active areas respectively, wherein the isolation structure is adjacent to the two word lines and located on interior sides of the two word lines facing towards the first ends, and a lightly-doped region and a P-well are adjacent to the two word lines and located on exterior sides of the two word lines facing away from the first ends, the lightly-doped region overlying the P-well and having a less doping concentration than the P-well and having a less doping concentration than the P-well, wherein the active areas are arranged in an array that includes a plurality of columns, and wherein the active areas arranged in the same one of the plurality of columns are aligned with one another, the "V" shapes of the active areas in one of the plurality of columns have openings oriented toward a first opening, the "V" shapes of the active areas in a first adjacent column and a second adjacent column of the plurality of columns adjacent to the one of the plurality of columns have openings oriented toward a second opening opposite to the first opening, and wherein the first segments of the active areas in the one of the plurality of columns are each respectively aligned with the second segments of the active areas in the first adjacent column, and the second segments of the active areas in the one of the plurality of columns are each respectively aligned with the first segments of the active areas in the second adjacent column, the first adjacent column is located to the right side of the one of the plurality of columns, the left-end contacts of the active areas in the first adjacent columns are all located to the right side of the right-end contacts of the active areas in the one of the plurality of columns.

5. The DRAM array of claim 4, wherein the "V" shapes of the active areas have openings with an angle ranging from 140° to 170°.

6. The DRAM array of claim 4, wherein each of the plurality of active areas is divided into three portions by the two of the plurality of word lines traversing the first segment and the second segment, the three portion being of the same size.

7. A method for fabricating a dynamic random access memory (DRAM) array, comprising:
  providing a semiconductor substrate;
  forming an isolation structure in the semiconductor substrate to define a plurality of active areas in the semiconductor substrate, each of the plurality of active areas comprising a first segment extending in a first direction and a second segment extending in a second direction, each of the first segment and the second segment having a first end and a second end opposing the first end, the first end of the first segment connected to the first end of the second segment so that the active area presents a "V" shape, a right-end contact and a left-end contact situated, respectively, at the second end of the first segment and the second end of the second segment on each of the plurality of active areas; and forming a plurality of word lines in the semiconductor substrate, such that two of the plurality of word lines intersect and traverse the first and second segments in each of the active areas respectively, wherein the isolation structure is adjacent to the two word lines and located on interior sides of the two word lines facing towards the first ends, and a lightly-doped region and a P-well are adjacent to the two word lines and located on exterior sides of the two word lines facing away from the first ends, the lightly-doped region overlying the P-well and having a less doping concentration than the P-well, wherein forming an isolation structure in the semiconductor substrate to define a plurality of active areas in the semiconductor substrate comprises:
    forming trenches in the semiconductor substrate by photolithography and etching processes, the trenches defining a plurality of V-shaped structures arranged in an array that includes a plurality of columns;
    filling the trenches with an isolation material to form the isolation structure; and
    doping the plurality of V-shaped structures to form the plurality of active areas, wherein the "V" shapes of the active areas in one of the plurality of columns have openings oriented toward a first opening, the "V" shapes of the active areas in a first adjacent column and a second adjacent column of the plurality of columns adjacent to the one of the plurality of columns have openings oriented toward a second opening opposite to the first opening, and wherein the first segments of the active areas in the one of the plurality of columns are each respectively aligned with the second segments of the active areas in the first adjacent column, and the second segments of the active areas in the one of the plurality of columns are each respectively aligned with the first segments of the active areas in the second adjacent column, the first adjacent column is located to the right side of the one of the plurality of columns, the left-end contacts of the active areas in the first adjacent columns are all located to the right side of the right-end contacts of the active areas in the one of the plurality of columns.

8. The method of claim 7, wherein the "V" shapes of the active areas have openings with an angle ranging from 140° to 170°.

9. The method of claim 7, further comprising situating two contacts at the ends of the "V" shape of each of the plurality of active areas.

10. The method of claim 7, wherein each of the plurality of active areas is divided into three portions by the two of the plurality of word lines traversing the first segment and the second segment, the three portion being of the same size.

* * * * *